United States Patent
Wu

(10) Patent No.: US 12,356,876 B2
(45) Date of Patent: *Jul. 8, 2025

(54) MEMORY DEVICE AND FORMATION METHOD THEREOF

(71) Applicant: Taiwan Semiconductor Manufacturing Company, Ltd., Hsinchu (TW)

(72) Inventor: Chao-I Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/671,947

(22) Filed: May 22, 2024

(65) Prior Publication Data
US 2024/0315153 A1    Sep. 19, 2024

Related U.S. Application Data

(63) Continuation of application No. 16/919,071, filed on Jul. 1, 2020, now Pat. No. 12,029,143.

(60) Provisional application No. 62/968,157, filed on Jan. 31, 2020.

(51) Int. Cl.
*H10N 70/00* (2023.01)
*H10N 70/20* (2023.01)

(52) U.S. Cl.
CPC ....... *H10N 70/8613* (2023.02); *H10N 70/231* (2023.02); *H10N 70/8413* (2023.02)

(58) Field of Classification Search
CPC .... H01L 45/122–1233; H10N 70/8613; H10N 70/8413
See application file for complete search history.

(56) References Cited

U.S. PATENT DOCUMENTS

2021/0091307 A1 * 3/2021 BrightSky ............ H10N 70/826

* cited by examiner

*Primary Examiner* — Moazzam Hossain
*Assistant Examiner* — Hajar Kolahdouzan
(74) *Attorney, Agent, or Firm* — JCIPRNET

(57) ABSTRACT

A memory device and a programming method of the memory device are provided. The memory device includes a bottom electrode, a heater, a phase change layer and a top electrode. The heater is disposed on the bottom electrode, and includes heat conducting materials different from one another in terms of electrical resistivity. A first one of the heat conducting materials has a periphery wall portion and a bottom plate portion connected to and surrounded by the periphery wall portion. A second one of the heat conducting materials is disposed on the bottom plate portion of the first one of the heat conducting materials, and laterally surrounded by the periphery wall portion of the first one of the heat conducting materials. The phase change layer is disposed on the heater and in contact with the heat conducting materials. The top electrode is disposed on the phase change layer.

20 Claims, 10 Drawing Sheets

MEMORY DEVICE AND FORMATION METHOD THEREOF

CROSS-REFERENCE TO RELATED APPLICATION

This application is a continuation of and claims the priority benefit of a prior application Ser. No. 16/919,071, filed on Jul. 1, 2020, which claims the priority benefit of U.S. provisional application with Ser. No. 62/968,157 and filed on Jan. 31, 2020. The entirety of the above-mentioned patent application is hereby incorporated by reference herein and made a part of this specification.

BACKGROUND

Phase change random access memory (PCRAM) is a promising candidate for next generation memories as having advantages including high speed, low power, non-volatility, high density and low cost. The PCRAM mainly includes a phase change material and a pair of electrodes at opposite sides of the phase change material. A resistance state (i.e., a logic state) of the PCRAM can be determined by crystallinity of the phase change material. Since one or more intermediate state(s) can exist between a crystalline state and an amorphous state of the phase change material, the PCRAM can have multiple resistance states, and can be used for multi-level programming. However, during the multi-level programming of the PCRAM, a verification step is often required to ensure adequate control of the resistance state of the PCRAM. As a consequence, programming speed of the PCRAM is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
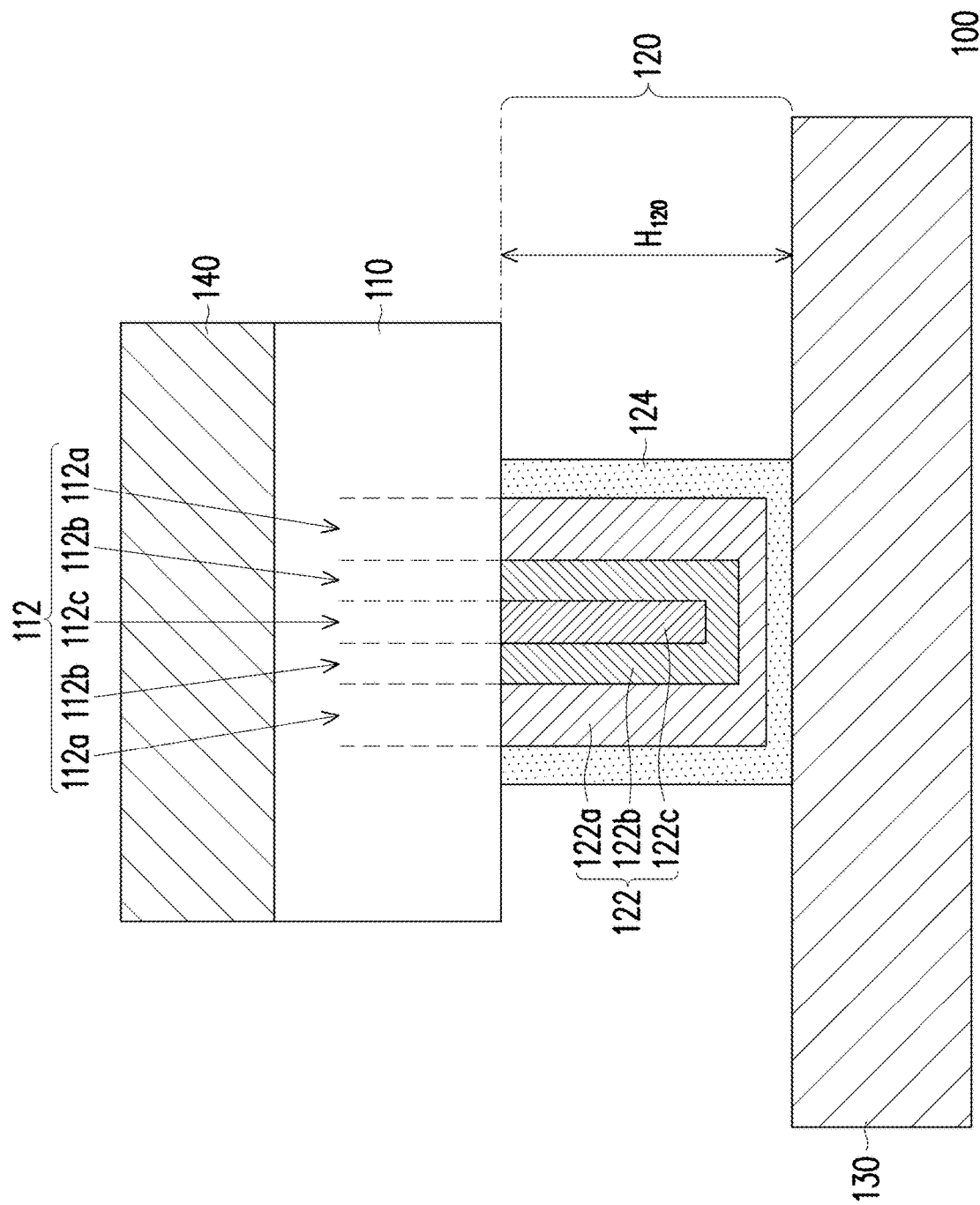
FIG. 1A is a schematic cross-sectional view illustrating a memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
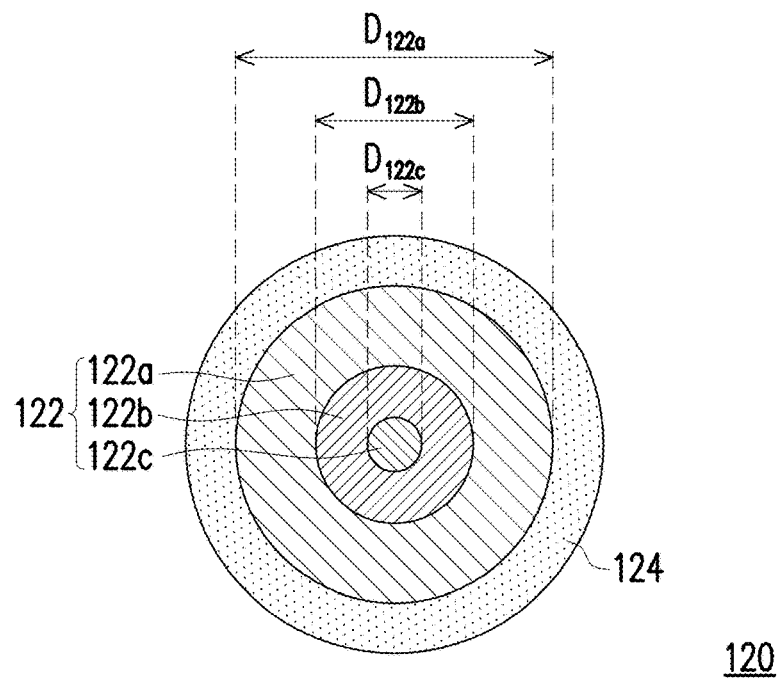
FIG. 1B is a schematic plan view illustrating a heater of the memory device as shown in FIG. 1A.
Figure 1C:
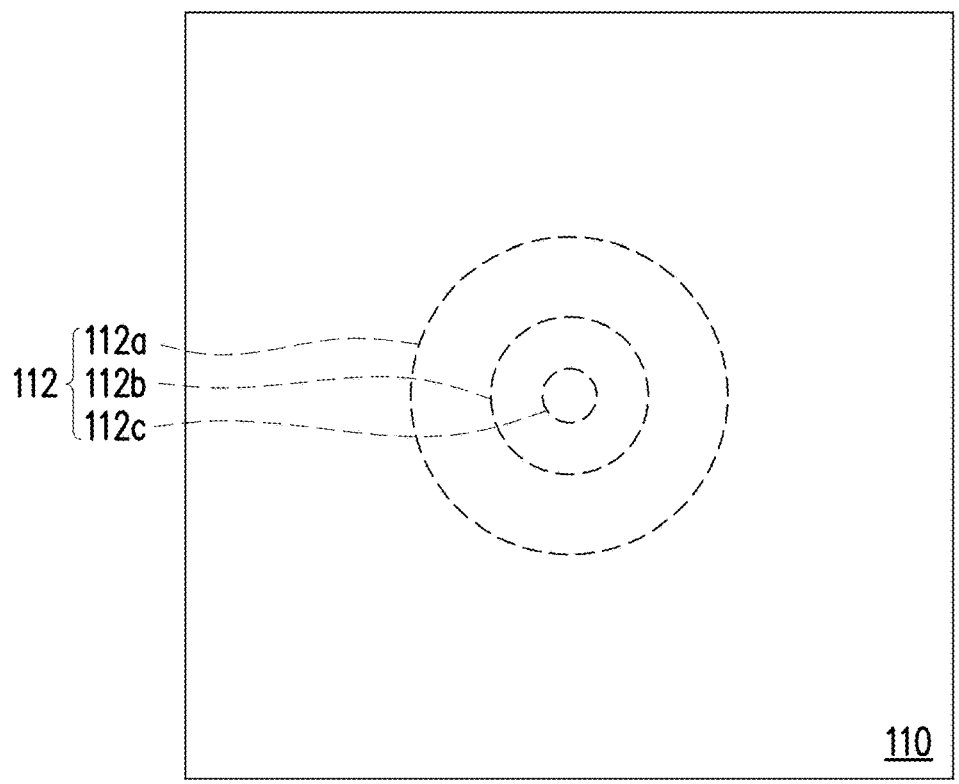
FIG. 1C is a schematic plan view illustrating active regions of a phase change layer in the memory device as shown in FIG. 1A.

FIG. 1A is a schematic cross-sectional view illustrating a memory device 100 according to some embodiments of the present disclosure. FIG. 1B is a schematic plan view illustrating a heater 120 of the memory device 100 as shown in FIG. 1A. FIG. 1C is a schematic plan view illustrating active regions 112 of the phase change layer 110 as shown in FIG. 1A.

Referring to FIG. 1A, in some embodiments, the memory device 100 is a storage unit in a phase change random access memory (PCRAM). The memory device 100 includes a phase change layer 110. As crystallinity of the phase change layer 110 is altered, the phase change layer 110 is able to be switched between multiple resistance states. Accordingly, the phase change layer 110 can be configured to store multiple logic states. When the phase change layer 110 has the highest crystallinity, the phase change layer 110 may have the lowest resistance, and a resistance state 11 (as will be described with reference to FIG. 3A) can be stored in the phase change layer 110. On the other hand, when the phase change layer 110 has the lowest crystallinity, the phase change layer 110 may have the highest resistance, and a resistance state 00 can be stored in the phase change layer 110 (as will be described with reference to FIG. 3A). Furthermore, in some embodiments, at least one intermediate state can exist between the resistance state 11 and the resistance state 00 (e.g., resistance states 01, 10 as will be described with reference to FIG. 3A). In these embodiments, the memory device 100 can be used for multi-level programming. The phase change layer 110 is made of a phase change material. In some embodiments, the phase change material is a chalcogenide material. In these embodiments, the chalcogenide material may include one or more of Ge, Te and Sb. For instance, the chalcogenide material may be GeSbTe, such as $Ge_2Sb_2Te_5$ (GST225), $Ge_4Sb_2Te_4$ (GST424) or so forth). In certain cases, the chalcogenide material may be doped with N, Si, C, In, Ga or the like, and an example of such chalcogenide material may be doped $Ge_6Sb_1Te_2$ (GST612). In some embodiments, a thickness of the phase change layer 110 may range from 100 Å to 600 Å. In addition, a method for forming the phase change layer 110 may include a deposition process, such as a physical vapor deposition (PVD) process or a chemical vapor deposition (CVD) process. However, those skilled in the art may select other suitable materials or other viable method for forming the phase change layer 110, and/or may modify dimension of the phase change layer 110 according to process requirements, the present disclosure is not limited thereto.

The memory device 100 further includes a heater 120. The heater 120 is configured to provide thermal energy to the phase change layer 110 via a joule heating manner, such that the crystallinity of the phase change layer 110 can be altered. In this way, the phase change layer 110 can be switched between different resistance states. The heater 120 includes multiple heat conducting materials 122 having different electrical resistivities, and these heat conducting materials 122 are in contact with different regions of the phase change layer 110. These regions of the phase change layer 110 are referred as active regions 112, as being close to or in contact with the heat conducting materials 122, and as undergoing a phase transition while being heated by the heat conducting materials 122. Since the heat conducting materials 122 have different electrical resistivities, the heat conducting materials 122 can provide different amounts of joule heat to the active regions 112 of the phase change layer 110, and change of crystallinity in the active regions 112 may be different from one another during a programming operation. In some embodiments, the heat conducting materials 122 with different electrical resistivities are made of the same material system (i.e., the same combination of elements), but may have different compositions (i.e., different elemental percentages). For instance, the heat conducting materials 122 may be made of titanium nitride, and have different titanium contents (e.g., titanium atomic percentages). The heat conducting material 122 with greater titanium content may exhibit lower electrical resistivity, and may produce less joule heat. On the other hand, the heat conducing material 122 with less titanium content may exhibit higher electrical resistivity, and produce greater joule heat.

In some embodiments, the heater 120 lies below the phase change layer 110, and may be formed in a pillar shape having a footprint area smaller than a footprint area of the phase change layer 110. The heater 120 may taper downwardly, or may have a width substantially constant along a vertical direction. In some embodiments, a height $H_{120}$ of the heater 120 ranges from 30 nm to 90 nm. Top surfaces of the heat conductive materials 122 collectively define at least a portion of a top surface of the heater 120, and are in contact with the active regions 112 of the phase change layer 110, respectively. At least one of the heat conducting materials 122 conformally cover a bottom surface and a sidewall of the heater 120, and may be formed in a cup shape having a periphery wall portion and a bottom plate portion connected to and surrounded by the periphery wall portion. Remainder of the heat conducting materials 122 is formed at an inner side of the heat conductive material(s) 122 having the cup shape, and may be formed in a pillar shape. For instance, the heat conducting materials 122 may include a heat conducting material 122a, a heat conducing material 122b and a heat conducting material 122c. The heat conducting materials 122a, 122b are respectively formed in a cup shape. The heat conducting material 122b is located at an inner side of the heat conducting material 122a, and covers an inner surface of the heat conductive material 122a. In addition, the heat conducting material 122c fills a recess defined by an inner surface of the heat conducing material 122b, and may be formed in a pillar shape. The heat conducting materials 122a, 122b, 122c have different electrical resistivities, in order to provide different amount of joule heat to the active regions 112 of the phase change layer 110. In those embodiments where the heat conducting materials 122 are made of titanium nitride, the heat conducting material 122a has a composition of $Ti_{x1}N_{y1}$, the heat conducting material 122b has a composition of $Ti_{x2}N_{y2}$, and the heat conducting material 122c has a composition of $Ti_{x3}N_{y3}$. The coefficients x1, x2, x3 are different from one another. Similarly, the coefficients y1, y2, y3 are different from one another. In certain cases, the heat conducting material 122a has the lowest electrical resistivity, the heat conducting material 122c has the highest electrical resistivity, and the heat conducting material 122b has an intermediate electrical resistivity. In these cases, the coefficient x1 is greater than the coefficient x2, and the coefficient x2 is greater than the coefficient x3. On the other hand, the coefficient y1 is smaller than the coefficient y2, and the coefficient y2 is smaller than the coefficient y3. In other words, a titanium atomic percentage in the heat conducting material 122a is greater than a titanium atomic percentage in the heat conducting material 122b, and the titanium atomic percentage in the heat conducting material 122b is greater than a titanium atomic percentage in the heat conducting material 122c. On the other hand, a nitrogen atomic percentage in the heat conducting material 122a is smaller than a nitrogen atomic percentage in the heat conducting material 122b, and the nitrogen atomic percentage in the heat conducting material 122b is smaller than a nitrogen atomic percentage in the heat conducting material 122c. For instance, the titanium atomic percentage and the nitrogen atomic percentage in the heat conducting material 122a respectively range from 45% to 55%. The titanium atomic percentage in the heat conducting material 122b may range from 35% to 45%, whereas the nitrogen atomic percentage in the heat conducting material 122b may range from 55% to 65%. The titanium atomic percentage in the heat conducting material 122c may range from 25% to 35%, whereas the nitrogen atomic percentage in the heat conducting material 122c may range from 65% to 75%.

Referring to FIG. 1B, in some embodiments, the heat conducting materials 122a, 122b, 122c are formed as having circular top view shapes. Viewing from above the heater 120, the heat conducting materials 122a, 122b, 122c may be concentric circular patterns, and the heat conducting material 122c is located within the heat conducting material 122b, which is located within the heat conducting material 122a. In this way, a diameter $D_{122a}$ of the circular top view shape of the heat conducting material 122a is greater than a diameter $D_{122b}$ of the circular top view shape of the heat conducting material 122b, which is greater than a diameter $D_{122c}$ of the circular top view shape of the heat conducting material 122c. For instance, a ratio of the diameter $D_{122a}$ with respect to the diameter $D_{122b}$ may range from 1 to 8, and a ratio of the diameter $D_{122a}$ with respect to the diameter $D_{122c}$ may range from 2 to 40. In addition, the diameter $D_{122a}$ may be in a range from 10 nm to 40 nm, the diameter $D_{122b}$ may be in a range from 5 nm to 10 nm, and the diameter $D_{122c}$ may be in a range from 1nm to 5 nm. However, those skilled in the art may form the heat conducting materials 122a, 122b, 122c as having other top view shapes (e.g., rectangular top view shapes), and/or adjust dimensions of the heat conducting materials 122a, 122b, 122c according to design requirements, the present disclosure is not limited thereto.

In some embodiments, a method for forming the heat conducting materials 122a, 122b, 122c includes forming an opening in a dielectric layer (e.g., one of the dielectric layers 210 as will be described with reference to FIG. 2) by a lithography process and an etching process. Subsequently, the heat conducting materials 122a, 122b, 122c are deposited in the opening by, for example, a chemical vapor deposition (CVD) process or an atomic layer deposition (ALD) process. The heat conducting materials 122a, 122b may be conformally deposited on a sidewall and a bottom surface of the opening, whereas the subsequently deposited heat conducting material 122c fills up the opening. In certain embodiments, recipes used for depositing the heat conducting materials 122a, 122b, 122c are identical to one another. Since dimensions of the heat conducting materials 122a, 122b, 122c sequentially reduce, compositions of the heat conducting materials 122a, 122b, 122c deposited by using the same recipe may be different from one another, and such composition variation is verified by using an energy-dispersive X-ray spectroscopy (EDX) analysis. As described above, in those embodiments where the heat conducting materials 122a, 122b, 122c are made of titanium nitride, the titanium atomic percentages of the heat conducting materials 122a, 122b, 122c may sequentially decrease, and the nitrogen atomic percentages of the heat conducting materials 122a, 122b, 122c may sequentially increase. It should be noted that, such relationship between the dimensions and the compositions of the heat conducting materials 122a, 122b, 122c deposited by using the same recipe may be observed when the dimensions of the heat conducting materials 122a, 122b, 122c are in a certain range. For instance, such relationship may be observed when the diameters $D_{122a}$, $D_{122b}$, $D_{122c}$ of the heat conducting materials 122a, 122b, 122c (as shown in FIG. 1B) are less than 40 nm, 10 nm, 5 nm, respectively. In alternative embodiments, the heat conducting materials 122a, 122b, 122c are deposited by using different recipes. In those embodiments where the heat conducting materials 122a, 122b, 122c are made of titanium nitride, the recipes for depositing the heat conducting materials 122a, 122b, 122c may have different ratios of titanium-containing precursor with respect to nitrogen-containing precursor (e.g., in terms of flow rate). For instance, the recipe for depositing the heat conducting material 122a has the highest value of such ratio, the recipe for depositing the heat conducting material 122c has the lowest value of such ratio, and the recipe for depositing the heat conducting material 122b has an intermediate value of such ratio.

Referring to FIG. 1A, FIG. 1B and FIG. 1C, in some embodiments, the active regions 112 of the phase change layer 110 include active regions 112a, 112b, 112c, which are extending upwardly from the top surfaces of the heat conducting materials 122a, 122b, 122c, respectively. The joule heats provided by the heat conducting materials 122a, 122b, 122c may move into the active regions 112a, 112b, 112c mainly along a vertical direction. Since the heat conducting materials 122a, 122b, 122c have different electrical resistivities, different amounts of joule heat can be provided to the active regions 112a, 112b, 112c. In this way, the active regions 112a, 112b, 112c may be selectively subjected to phase transition. In other words, by controlling an input current provided to the heater 120, some of the active regions 112a, 112b, 112c can be subjected to a phase transition, while no phase transition or a reverse phase transition may be observed in other(s) of the active regions 112a, 112b, 112c. Accordingly, multiple intermediate resistance states can exist between the most crystallized state (i.e., the lowest resistance state) and the most amorphous state (i.e., the highest resistance state) of the phase change layer 110, and a multi-level programming can be performed by using the memory device 100. In addition, the phase change layer 110 can be accurately programmed to a certain resistance state by controlling how many of the active regions 112a, 112b, 112c is/are subjected to phase transition(s) and what direction each phase transition goes. In this way, a verification step may be omitted, and a speed of multi-level programming of the memory device 100 may be improved. As shown in FIG. 1B and FIG. 1C, in those embodiments where the top view shapes of the heat conducting materials 122a, 122b, 122c are circular and concentric, the active regions 112a, 112b, 112c may have circular and concentric top view shapes as well. The diameters of the top view shapes of the active regions 112a, 112b, 112c may be slightly greater than, equal to or slightly less than the diameters $D_{122a}$, $D_{122b}$, $D_{122c}$ of the top view shapes of the heat conducting materials 122a, 122b, 122c. In addition, as shown in FIG. 1A, the active regions 112a, 112b, 112c may not extend to a top surface of the phase change layer 110. Alternatively, the active regions 112a, 112b, 112c span from a bottom surface to the top surface of the phase change layer 110.

In alternative embodiments, the heater 120 may include more/less than three of the heat conducting materials 122, and an amount of the active regions 112 and a span of each active region 112 may be altered accordingly.

Referring to FIG. 1A, in some embodiments, the heater 120 further includes a heat isolation layer 124. The heat isolation layer 124 encloses a sidewall and a bottom surface of the outermost one of the heat conducting materials 122 (e.g., the heat conducting material 122a), and may be configured to block the joule heat produced by the heat conducting materials 122 from laterally leaking to surrounding components. A top surface of the heat isolation layer 124 and the top surfaces of the heat conducting materials 122 collectively define the top surface of the heater 120. A sidewall and a bottom surface of the heat isolation layer 124 define a sidewall and a bottom surface of the heater 120, respectively. In addition, a height of the heat isolation layer 124 defines the height $H_{120}$ of the heater 120, and a footprint area of the heat isolation layer 124 defines a footprint area of the heater 120. The heat isolation layer 124 may be composed of a first material, whereas the heat conducting materials 122 are made of a second material. A thermal conductivity of the first material is smaller than a thermal conductivity of the second material. For instance, the first material may include tantalum nitride, which has a thermal conductivity of about 3 W/mK, whereas the second material may include titanium nitride, which has a thermal conductivity of about 20 W/mK. In addition, a method for forming the heat isolation layer 124 may include a deposition process, such as a PVD process or a CVD process. However, those skilled in the art may select other suitable material or other viable method for forming the heat isolation layer 124 according to process requirements, the present disclosure is not limited thereto.

Referring to FIG. 1A, the memory device 100 further includes a bottom electrode 130 and a top electrode 140. The heater 120 and the phase change layer 110 are in electrical contact with the bottom electrode 130 and the top electrode 140. Whether an electrical current could pass through the heater 120 and the phase change layer 110 can be controlled by adjusting a voltage bias between the bottom electrode 130 and the top electrode 140. In this way, reading and programming operations of the memory device 100 can be performed by controlling signals provided to the bottom electrode 130 and the top electrode 140. A top surface of the bottom electrode 130 may be in contact with the bottom surface of the heater 120 (e.g., the bottom surface of the heat isolation layer 124), and a bottom surface of the top electrode 140 may be in contact with a top surface of the phase change layer 110. In some embodiments, a footprint area of the bottom electrode 130 is greater than the footprint area of the heater 120, and a portion of the bottom electrode 130 may laterally surround the heater 120. In addition, in some embodiments, a footprint area of the top electrode 140 is substantially identical to the footprint area of the phase change layer 110, and a sidewall of the top electrode 140 may be substantially coplanar with a sidewall of the phase change layer 110. However, those skilled in the art may modify the footprint areas of the bottom electrode 130 and the top electrode 140 according to design requirements, as long as the bottom electrode 130 and the top electrode 140 are in electrical contact with the heater 120 and the phase change layer 110. In addition, in some embodiments, materials of the bottom electrode 130 and the top electrode 140 may respectively include Al, Cu, AlCu, W or other metallic materials.

Figure 2:
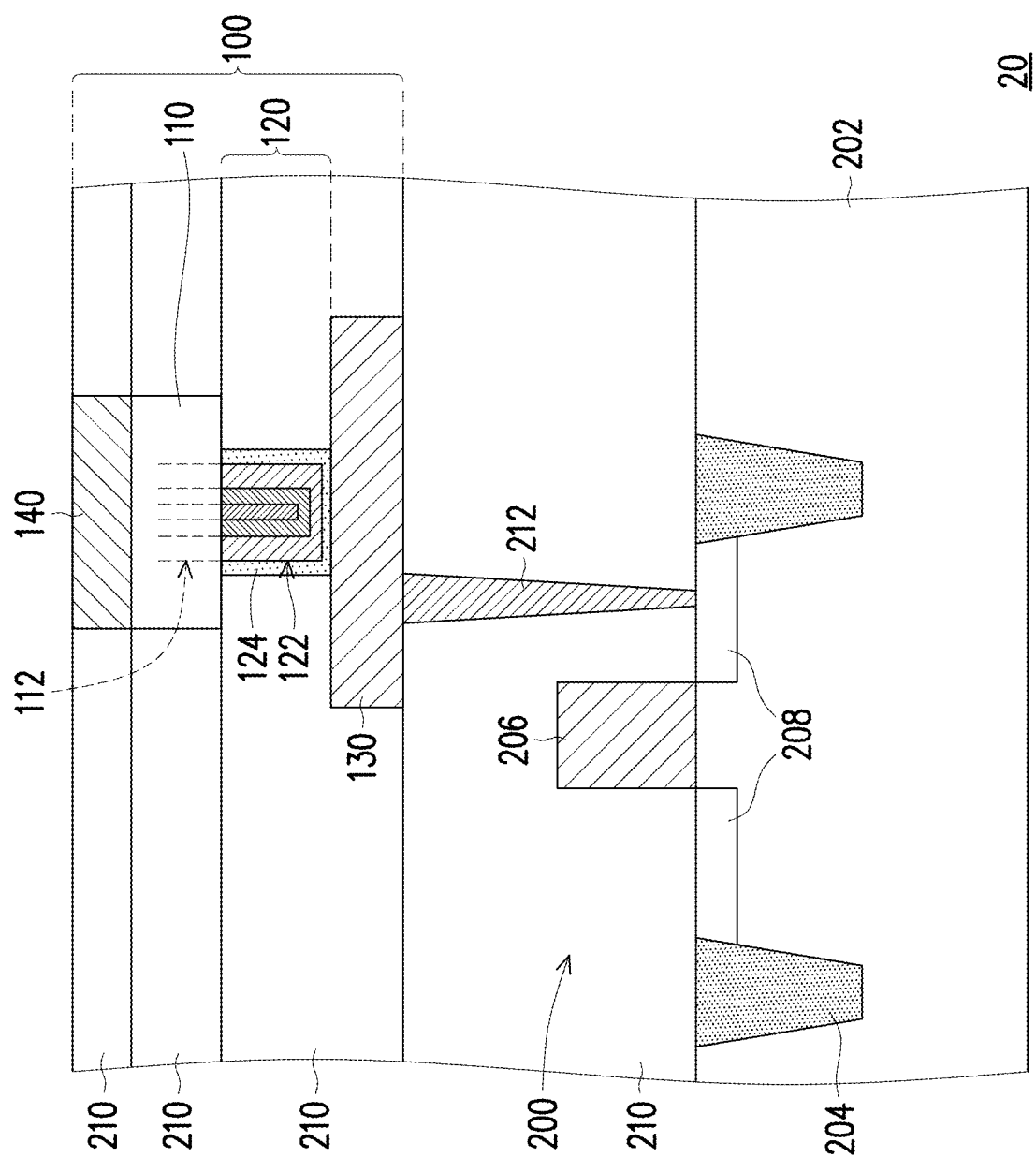
FIG. 2 is a cross-sectional view illustrating a memory cell in a memory integrated circuit according to some embodiments of the present disclosure.

FIG. 2 is a cross-sectional view illustrating a memory cell 20 in a memory integrated circuit according to some embodiments of the present disclosure.

Referring to FIG. 1A and FIG. 2, in some embodiments, a PCRAM integrated circuit includes a plurality of memory cells 20 each exemplarily illustrated in FIG. 2. The memory cell 20 includes an access transistor 200, and includes the memory device 100 electrically connected to a source terminal or a drain terminal of the access transistor 200. The access transistor 200 is functioned as a switch controlling access to the memory device 100. In some embodiments, the access transistor 200 is a planar-type metal-oxide-semiconductor field effect transistor (MOSFET). In these embodiments, the access transistor 200 is formed in and over a portion of a semiconductor substrate 202 having a planar top surface. This portion of the semiconductor substrate 202 may be referred as an active region of the access transistor 200. An isolation structure 204 may be formed in the semiconductor substrate 202, and laterally surrounds the active region of the access transistor 200. The access transistor 200 may include a gate structure 206 covering the active region of the access transistor 200, and may include doped regions 208 formed in the active region and located at opposite sides of the gate structure 206. The gate structure 206 may be functioned as a gate terminal of the access transistor 200, and may include a gate dielectric layer and a gate electrode covering the gate dielectric layer (both not shown). The gate electrode may be a portion of one of the word lines (not shown) functioned for switching on/off the access transistors 200 of a column/row of the memory cells 20. In addition, the doped regions 208 may be functioned as the source and drain terminals of the access transistor 200, and may have a conductive type (e.g., N type) opposite to a conductive type (e.g., P type) of the active region of the access transistor 200. One of the doped regions 208 may be electrically connected to the memory device 100, while the other one of the doped regions 208 may be electrically connected to a source line (not shown) configured to receive a reference voltage (e.g., a ground voltage). In addition, the top electrode 140 of the memory device 100 may be connected to a bit line (not shown). By switching the access transistor 200 and controlling the voltage of the bit line, input current provided to the memory device 100 can be controlled. In alternative embodiments, the access transistor 200 is a fin-type MOSFET (also referred as fin-FET). In these alternative embodiments, the access transistor 200 is formed in and over an active region shaped as a fin structure (not shown), and the gate structure 206 may cover a sidewall and a top surface of the fin-shape active region. Furthermore, in some embodiments, the doped regions 208 may be replaced by epitaxial structures formed in recesses at a top portion of the active region. Those skilled in the art may modify structure, configuration and dimensions of the access transistor 200 according to design requirements, the present disclosure is not limited thereto.

In some embodiments, the memory device 100 is formed in a stack of dielectric layers 210 disposed on the semiconductor substrate 202. The access transistor 200 is covered by the bottommost one of the dielectric layers 210. In some embodiments, the memory device 100 may be disposed on the bottommost one of the dielectric layers 210, and laterally surrounded by others of the dielectric layers 210. When the access transistor 200 is in an on-state, whether the memory device 100 is subjected to a reading/programming operation can be determined by a potential difference between the bit line connected to the top electrode 140 of the memory device 100 and the source line connected to one of the doped regions 208 of the access transistor 200. A contact plug 212 may penetrate through the bottommost dielectric layer 210, in order to establish electrical connection between the memory device 100 and one of the source and drain terminals of the access transistor 200 (e.g., one of the doped regions 208). In some embodiments, the contact plug 212 is in contact with the bottom electrode 130 of the memory device 100. In alternative embodiments, the memory device 100 is vertically spaced apart from the contact plug 212, and electrically connected to the contact plug 212 through interconnection(s) (not shown) formed in additional dielectric layer(s) between the memory device 100 and the contact plug 212.

In some embodiments, the memory cells 20 are formed within a central region of the integrated circuit, and are laterally surrounded by a peripheral region of the integrated circuit (not shown). The peripheral region of the integrated circuit may include logic circuits configured to manage data input/output during reading/programming operations of the memory cells 20. For instance, the logic circuits may include field effect transistors respectively similar to the access transistor 200 as described above. In addition, the logic circuits may be free of a memory device (e.g., the memory device 100 as described above).

Figure 3A:
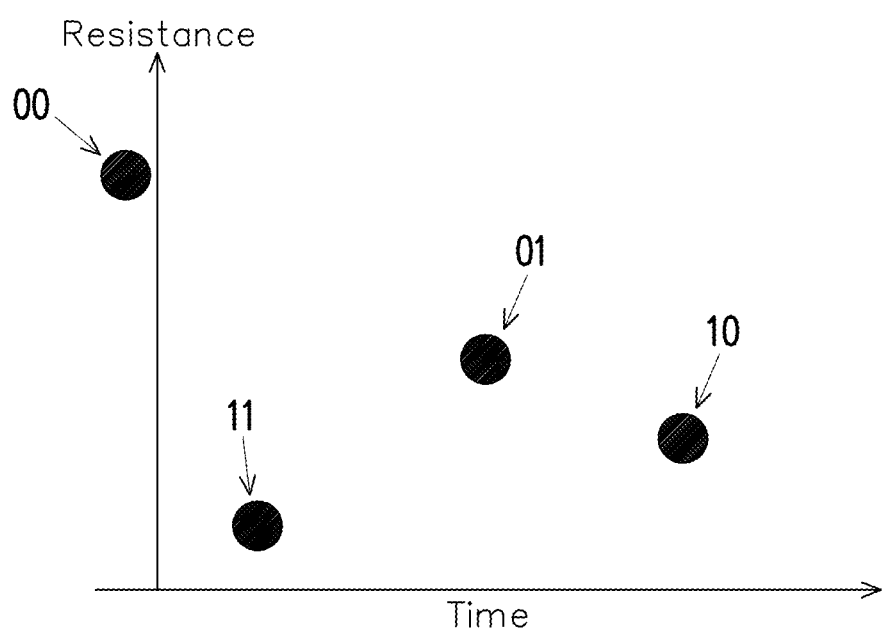
FIG. 3A is a schematic diagram illustrating various resistance states of a memory device before and during a set programming operation according to some embodiments of the present disclosure.
Figure 3B:
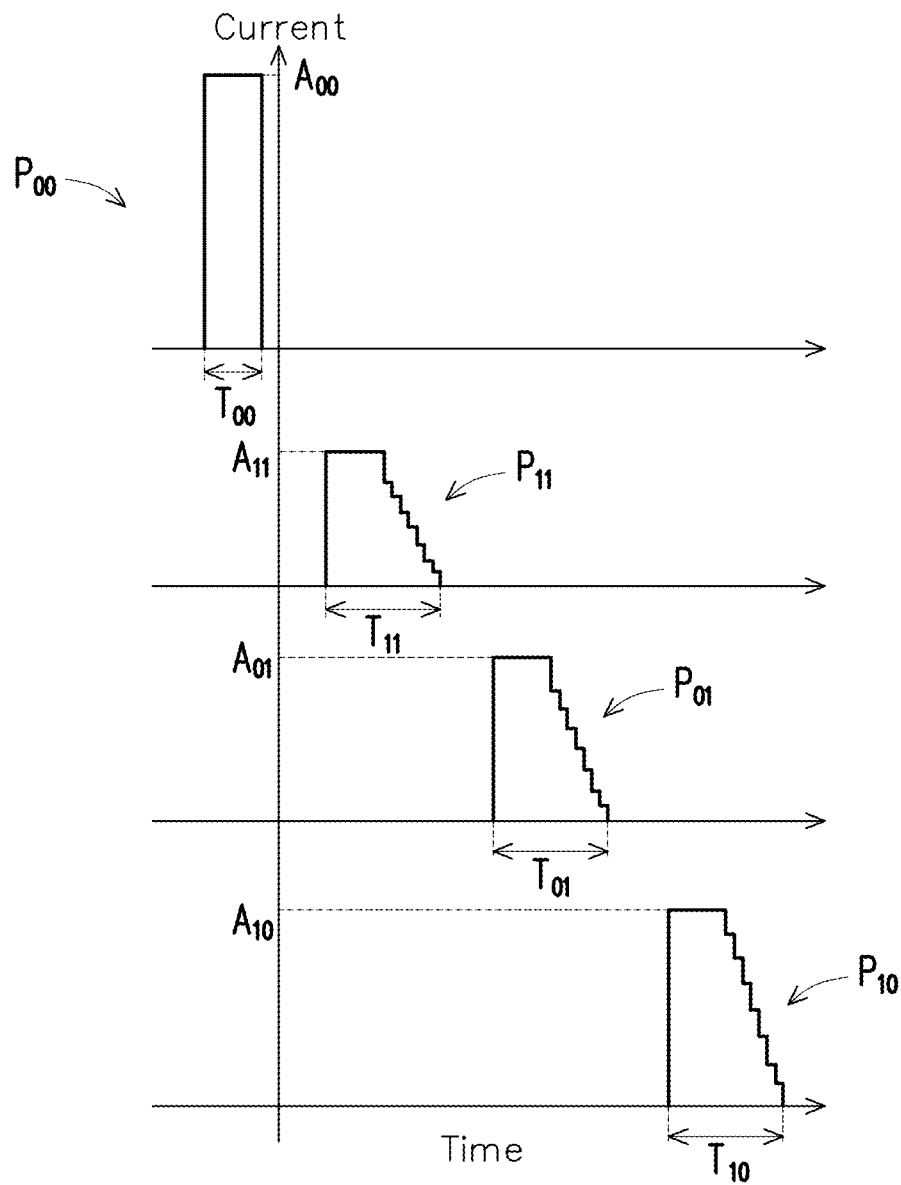
FIG. 3B is a schematic diagram illustrating waveforms of input currents provided to the memory device before and during a set programming operation according to some embodiments of the present disclosure.

FIG. 3A is a schematic diagram illustrating various resistance states of the memory device 100 before and during a set programming operation according to some embodiments of the present disclosure. FIG. 3B is a schematic diagram illustrating waveforms of input currents provided to the memory device 100 before and during a set programming operation according to some embodiments of the present disclosure. FIG. 4A through FIG. 4D are schematic diagrams illustrating the heater 120 and the phase change layer 110 of the memory device 100 at various stages before and during the set programming operation according to some embodiments of the present disclosure.

Figure 4A:
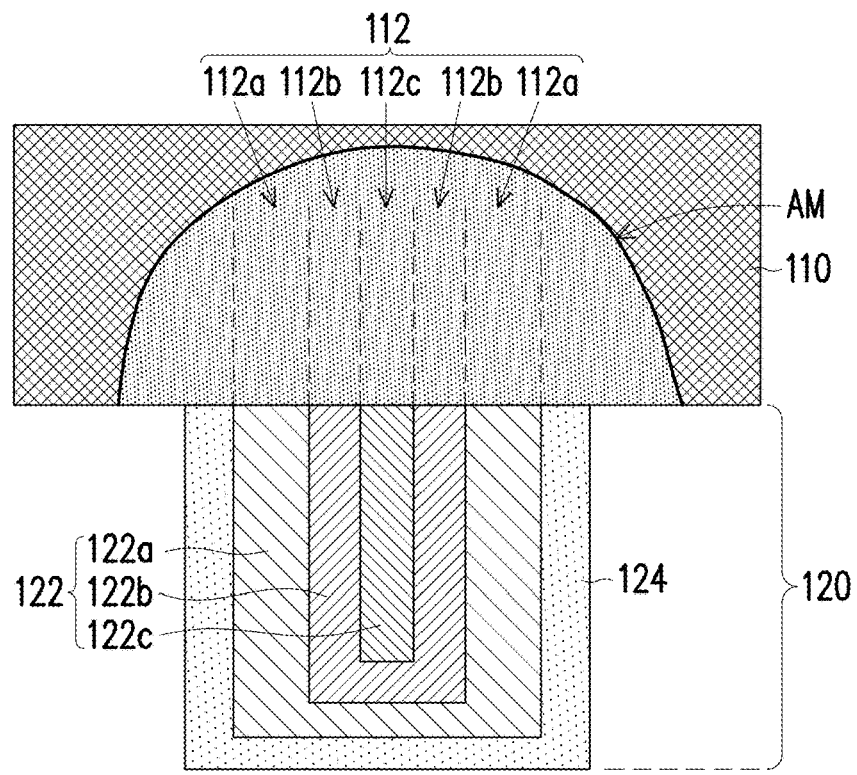
FIG. 4A through FIG. 4D are schematic diagrams illustrating the heater and the phase change layer of the memory device at various stages before and during the set programming operation according to some embodiments of the present disclosure.

Referring to FIG. 3A, FIG. 3B and FIG. 4A, in some embodiments, the set programming operation is a multi-level set programming operation, and a resistance state of the phase change layer 110 changes from a highest resistance state 00 to multiple low resistance states during the set programming operation. For instance, these low resistance states include a resistance state 11 with the lowest resistance, and include resistance states 01, 10 with resistances between the highest resistance and the lowest resistance corresponding to the resistance states 00, 11, respectively. In some embodiments, prior to the set programming operation, the entire phase change layer 110 may be in a crystalline phase, and then at least partially subjected to a phase transition from the crystalline phase to an amorphous state. In this way, the phase change layer 110 is at least partially amorphous before initiation of the set programming operation, and is in the highest resistance state 00. In some embodiments, as shown in FIG. 4A, a portion AM of the phase change layer 110 in contact with the heater 120 turns into the amorphous state before the set programming operation, while the remaining portion of the phase change layer 110 stays crystallized. The active regions 112 of the phase change layer 110 are included in the portion AM, and are currently amorphous. As shown in FIG. 3B, in order to turn the portion AM of the phase change layer 110 into the amorphous state, a current pulse $P_{00}$ may be provided to the heater 120. An amplitude $A_{00}$ of the current pulse $P_{00}$ is high enough that the joule heats provided to the phase change layer 110 by the heat conducting materials 122 are able to substantially melt the portion AM of the phase change layer 110. In addition, a duration time $T_{00}$ of the current pulse $P_{00}$ is short enough that the melted portion AM can be quenched to form the amorphous state. In some embodiments, the current pulse $P_{00}$ is provided with a sharp/abrupt rising edge and a sharp/abrupt falling edge. For instance, the current pulse $P_{00}$ may be a rectangular current pulse. Those skilled in the art may adjust the amplitude $A_{00}$, the duration time $T_{00}$ and other characteristics of the current pulse $P_{00}$ according to materials of the heater 120 and the phase change layer 110 or other process conditions, the present disclosure is not limited thereto. Moreover, a shape and a volume of the portion AM of the phase change layer 110 may be altered along with adjustment of the current pulse $P_{00}$ and/or selection of the materials of the heater 120 and the phase change layer 110, the present disclosure is not limited thereto as well.

Figure 4B:
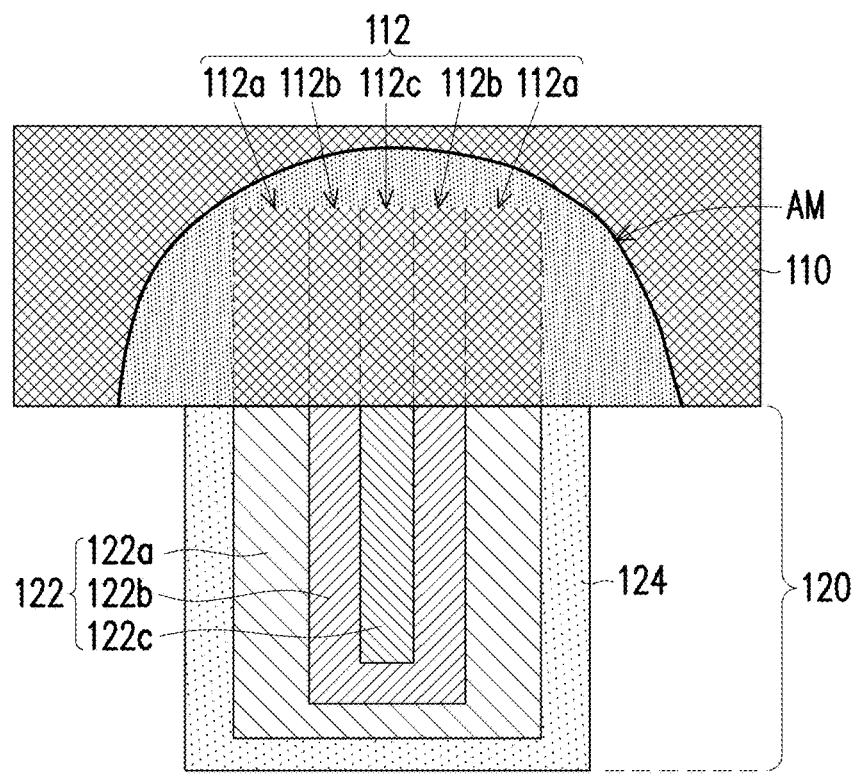

Referring to FIG. 3A, FIG. 3B and FIG. 4B, in some embodiments, during the transition from the resistance state 00 to the resistance state 11, a resistance of the phase change layer 110 is drop from a highest level to a lowest level. As shown in FIG. 4B, in some embodiments, all of the active regions 112 are crystallized by receiving the joule heats provided by the heat conducting materials 122 during the transition from the resistance state 00 to the resistance state 11. On the other hands, the remaining region in the portion AM of the phase change layer 110 stays amorphous. Alternatively, the remaining region in the portion AM of the phase change layer 110 is at least partially crystallized, along with the crystallization of the active regions 112. As shown in FIG. 3B, in order to crystallize all of the active regions 112, a current pulse $P_{11}$ may be provided to the heater 120. An amplitude $A_{11}$ of the current pulse $P_{11}$ should be high enough that the joule heats provided to the phase change layer 110 by the heat conductive materials 122 are able to crystallize all of the active regions 112 in the phase change layer 110. Considering the heat conducting materials 122 are formed as having different electrical resistivities, even the joule heat produced by the heat conducting material 122 with the lowest electrical resistivity (e.g., the heat conducting material 122a) upon receiving the current pulse $P_{11}$ should be able to crystallize the corresponding active region 112 (e.g., the active region 112a). In addition, the amplitude $A_{11}$ of the current pulse $P_{11}$ should not be too high to result in melting of the active regions 112. In other words, even the joule heat produced by the heat conducting material 122 with the highest electrical resistivity (e.g., the heat conducting material 122c) upon receiving the current pulse $P_{11}$ should not be able to melt the corresponding active region 112 (e.g., the active region 112c). As a result, the amplitude $A_{11}$ of the current pulse $P_{11}$ should be lower than the amplitude $A_{00}$ of the current pulse $P_{00}$. Moreover, a duration time $T_{11}$ of the current pulse $P_{11}$ should be long enough not to result in quenching of the crystallized active regions 112, so as to avoid from accidentally turning the active regions 112 into the amorphous state. In this way, the duration time $T_{11}$ of the current pulse $P_{11}$ should be longer than the duration time $T_{00}$ of the current pulse $P_{00}$. In some embodiments, the current pulse $P_{11}$ has a stair-down falling edge (i.e., a stepwise descending edge), in order to reduce a cooling rate of the active regions 112 in the phase change layer 110. On the other hand, as similar to the current pulse $P_{00}$, the current pulse $P_{11}$ may have a sharp/abrupt rising edge as well. However, those skilled in the art may adjust the amplitude $A_{11}$, the duration time $T_{11}$, shape and other characteristics of the current pulse $P_{11}$ according to materials of the heater 120 and the phase change layer 110 or other process conditions, as long as all of the active regions 112 are ensured to be crystallized.

Figure 4C:
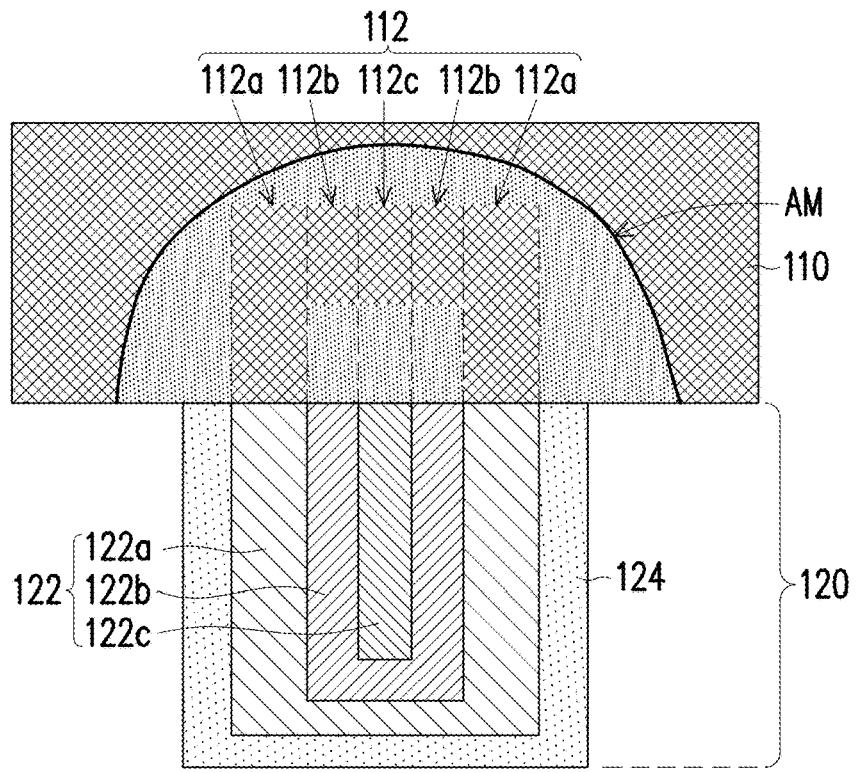

Referring to FIG. 3A, FIG. 3B and FIG. 4C, in some embodiments, the resistance state of the phase change layer 110 is subsequently changed from the lowest resistance state 11 to the resistance state 01 with a resistance lower than the highest resistance corresponding to the resistance state 00, and higher than the lowest resistance corresponding to the resistance state 11. As shown in FIG. 3B, during the transition from the resistance state 11 to the resistance state 01, a current pulse $P_{01}$ is provided to the heater 120. An amplitude $A_{01}$ of the current pulse $P_{01}$ is higher than the amplitude $A_{11}$ of the current pulse $P_{11}$, and is lower than the amplitude $A_{00}$ of the current pulse $P_{00}$. In addition, a duration time $T_{01}$ of the current pulse $P_{01}$ is longer than the duration time $T_{00}$ of the current pulse $P_{00}$, and may be slightly longer than, identical to or slightly shorter than the duration time $T_{11}$ of the current pulse $P_{11}$. In some embodiments, as similar to the current pulse $P_{11}$, the current pulse $P_{01}$ has a stair-down falling edge, and has a sharp/abrupt rising edge. As shown in FIG. 4C, such current pulse $P_{01}$ may render some of the active regions 112 at least partially amorphous. On the other hand, other(s) of the active regions 112 may stay crystallized. Accordingly, an overall resistance of the phase change layer 110 is slightly increased, but not greater than the highest resistance corresponding to the resistance state 00 since at least some portions in the active regions 112 stay crystallized. For instance, the active regions 112b, 112c receiving the joule heats provided by the heat conducting materials 122b, 122c with relatively high electrical resistivities are at least partially melted, and then cooled down to form amorphous parts in the active regions 112b, 112c. In those embodiments where the heater 120 is disposed below the phase change layer 110, the joule heats are provided from below the active regions 112b, 112c. Accordingly, the amorphous parts of the active regions 112b, 112c may extend upwardly from bottoms of the active regions 112b, 112c, and may or may not reach tops of the active regions 112b, 112c. On the other hand, when the heater 120 receives the current pulse $P_{01}$, a joule heat provided by the heat conducting material 122a with the relatively low electrical resistivity may not be sufficient to melt the active region 112a. As a result, the active region 112a may stay crystallized.

Figure 4D:
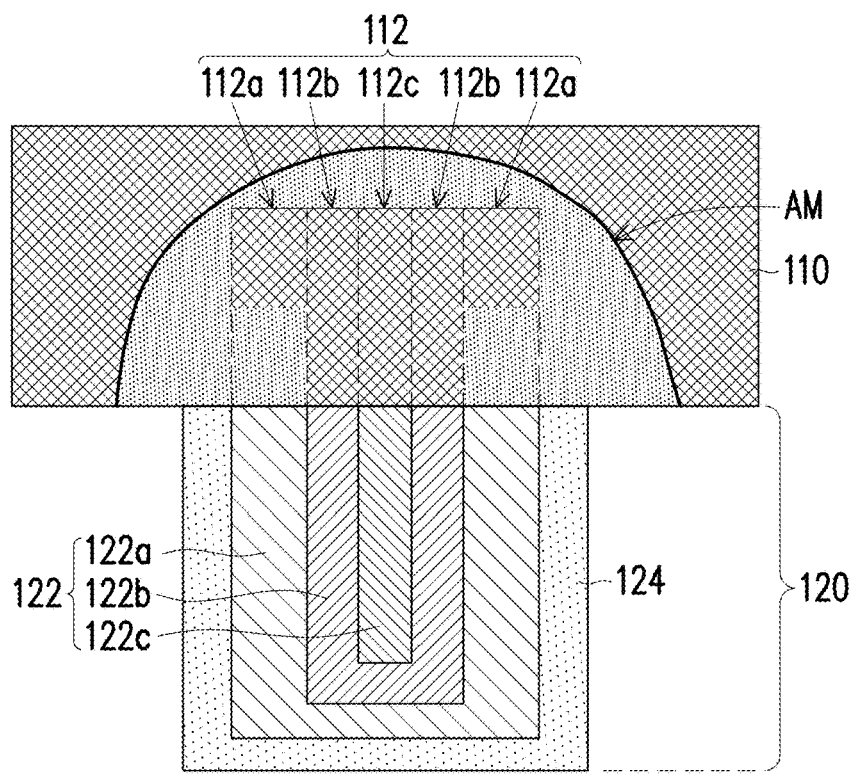

Referring to FIG. 3A, FIG. 3B and FIG. 4D, in some embodiments, the resistance state of the phase change layer 110 is subsequently changed from the resistance state 01 to the resistance state 10. As shown in FIG. 3A, a resistance of the resistance state 10 is slightly lower than the resistance of the resistance state 01, but higher than the lowest resistance corresponding to the resistance state 11. As shown in FIG. 3B, during the transition from the resistance state 01 to the resistance state 10, a current pulse $P_{10}$ is provided to the heater 120. An amplitude $A_{10}$ of the current pulse $P_{10}$ is higher than the amplitude $A_{01}$ of the current pulse $P_{01}$, but lower than the amplitude $A_{00}$ of the current pulse $P_{00}$. In addition, a duration time $T_{10}$ of the current pulse $P_{10}$ is longer than the duration time $T_{00}$ of the current pulse $P_{00}$, and may be slightly longer than, identical to or slightly shorter than the duration time $T_{01}$ of the current pulse Por. In some embodiments, as similar to the current pulse $P_{11}$, the current pulse $P_{10}$ has a stair-down falling edge, and has a sharp/abrupt rising edge. As shown in FIG. 4D, when the heater 120 receives the current pulse $P_{10}$, the amorphous parts previously existed in some of the active regions 112 may currently be re-crystallized as being heated by the corresponding heat conductive material(s) 122. On the other hand, the current pulse $P_{10}$ may render other(s) of the active regions 112 partially amorphous. For instance, when the heater 120 receives the current pulse $P_{10}$, the amorphous parts previously existed in the active regions 112b, 112c are currently re-crystallized while receiving the joule heats provided by the heat conducting materials 122b, 122c. In addition, the active region 112a previously stayed crystallized is at least partially melted and then cooled down to form an amorphous part in the active region 112a upon receiving the joule heat provided by the heat conducting material 122a. In those embodiments where the heater 120 is disposed below the phase change layer 110, the joule heat is provided from below the active region 112a. Accordingly, the amorphous part of the active region 112a may extend upwardly from bottom of the active region 112a, and may or may not reach top of the active region 112a. Since the amorphous parts previously existed in the active regions 112b, 112c are currently re-crystallized, a resistance of the phase change layer 110 may decrease. In addition, the resistance of the phase change layer 110 at the resistance state 10 may not be lower than the resistance corresponding to the resistance state 11 because the active region 112a becomes partially amorphous.

According to the embodiments described with reference to FIG. 3A, FIG. 3B and FIG. 4A through FIG. 4D, during the set programming operation, the resistance state of the phase change layer 110 changes from the resistance state 00 to the resistance state 10 through the resistance state 11 and the resistance state 01. The resistance state 00 has the highest resistance, the resistance state 11 has the lowest resistance, and resistances of the resistance states 10, 01 are between the highest resistance and the lowest resistance corresponding to the resistances states 00, 11, respectively. During the transition from the resistance state 00 with the highest resistance to the resistance state 11 with the lowest resistance, all of the active regions 112 turn from the amorphous state to the crystalline state, and a significant resistance drop can be observed. During the transition from the resistance state 11 to the resistance state 01, some of the active regions 112 may be at least partially subjected to a phase transition from the crystalline phase to the amorphous state, and a resistance of the phase change layer 110 is increased accordingly (but still lower than the highest resistance corresponding to the resistance state 00). Subsequently, during the transition from the resistance state 01 to the resistance state 10, the amorphous parts previously existed in some of the active regions 112 may be re-crystallized, and the active region 102 previously crystallized may currently be at least partially subjected to a phase transition from the crystalline phase to the amorphous state. Consequently, a resistance of the phase change layer 110 is slightly lowered during the transition from the resistance state 01 to the resistance state 10 (but not lower than the lowest resistance corresponding to the resistance state 11). Therefore, by selecting different sets of the active regions 112 for phase transition, the phase change layer 110 can be programmed with more than two resistance states. In other words, a multi-level set programming can be achieved by using the memory device 100. In addition, the phase change layer 110 can be accurately programmed to a certain resistance state by controlling how many of the active regions 112a, 112b, 112c are subjected to phase transition(s) and what direction each phase transition goes. In this way, a verification step following each transition from one resistance state to another may be omitted, and a speed of the multi-level set programming of the memory device 100 may be effectively improved.

Figure 5:
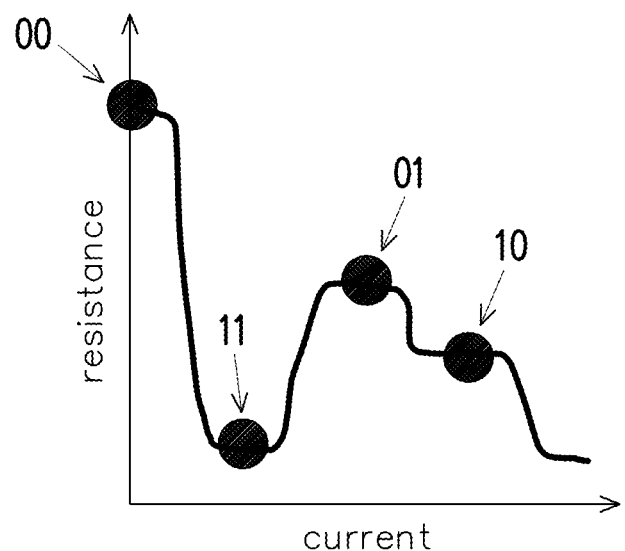
FIG. 5 is a diagram of a resistance variation of the phase change layer with respect to a variation of amplitude of the current input to the heater during a set programming operation according to some embodiments of the present disclosure.

FIG. 5 is a diagram of a resistance variation of the phase change layer 110 with respect to a variation of amplitude of the current input to the heater 120 during a set programming operation according to some embodiments of the present disclosure.

Referring to FIG. 1A and FIG. 5, as the amplitude of the current input to the heater 120 increases, the resistance of the phase change layer 110 is changed from the resistance state 00 to the resistance states 11, 01, 10. As shown in FIG. 5, steps can be observed from the resistance variation of the phase change layer 110 as the amplitude of the current input increases, and the resistance states 11, 01, 10 are defined at these steps. In other words, the resistance of the phase change layer 110 is substantially fixed within ranges of these steps. Therefore, the phase change layer 110 can be accurately programmed to the resistance states 11, 01, 10 by controlling the amplitude of the input current to be within certain ranges corresponding to these steps of the resistance variation. Accordingly, a verification step may be omitted from the multi-level set programming of the memory device 100. Furthermore, in certain embodiments, the multi-level set programming process does not have to follow the sequence from the resistance states 00 to the resistance state 10 through the resistance states 01, 10 as described with reference to FIG. 3A, FIG. 3B and FIG. 4A through FIG. 4D. In these certain embodiments, the resistance of the phase change layer 110 may be directly changed from the resistance state 00 to the resistance states 11, 01, 10 during the multi-level set programming process by setting the input currents provided to the heater 120 respectively within a range corresponding to a step of the resistance variation of the phase change layer 110 as shown in FIG. 5.

It should be noted that, although the multi-level set programming process is described with reference to FIG. 4A through FIG. 4D by using a mechanism regarding selecting different combinations of the active regions 112 for phase transition(s) and controlling the direction of each phase transition, other mechanism(s) can be used to explain the relationship of the resistance variation of the phase change layer 110 with respect to the input current provided to the heater 120 during the multi-level set programming process, the present disclosure is not limited thereto.

Figure 6:
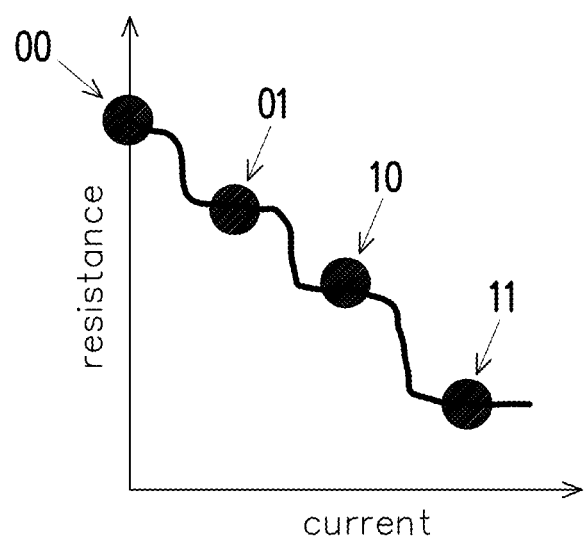
FIG. 6 is a diagram of a resistance variation of the phase change layer with respect to a variation of amplitude of the current input to the heater during a set programming operation according to alternative embodiments of the present disclosure.
Figure 7A:
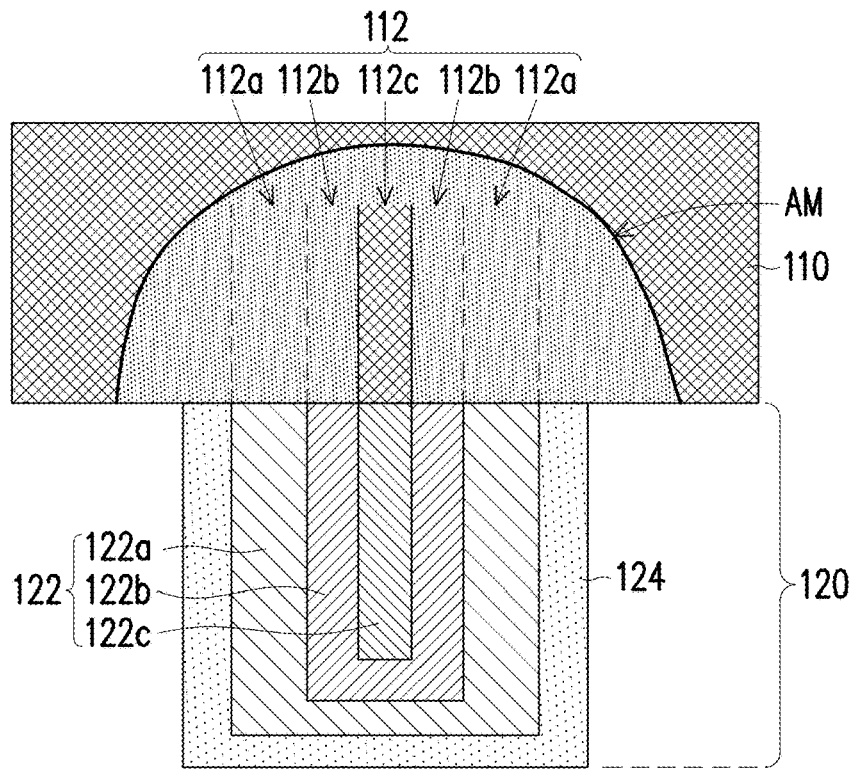
FIG. 7A through FIG. 7C are schematic diagrams illustrating the heater and the phase change layer of the memory device at various stages during the set programming operation according to alternative embodiments of the present disclosure.
Figure 7B:
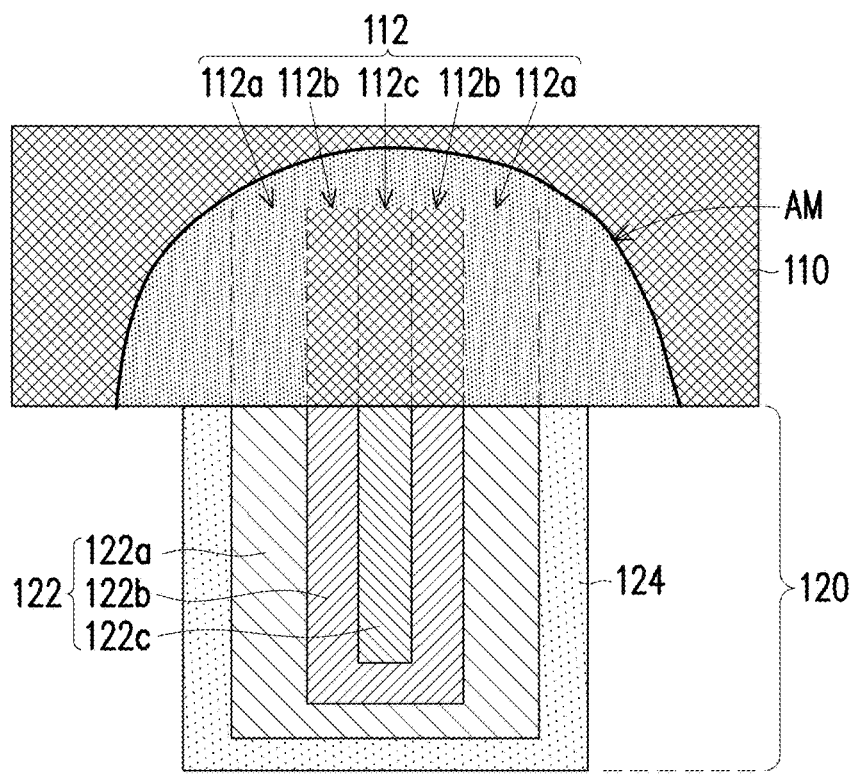
Figure 7C:
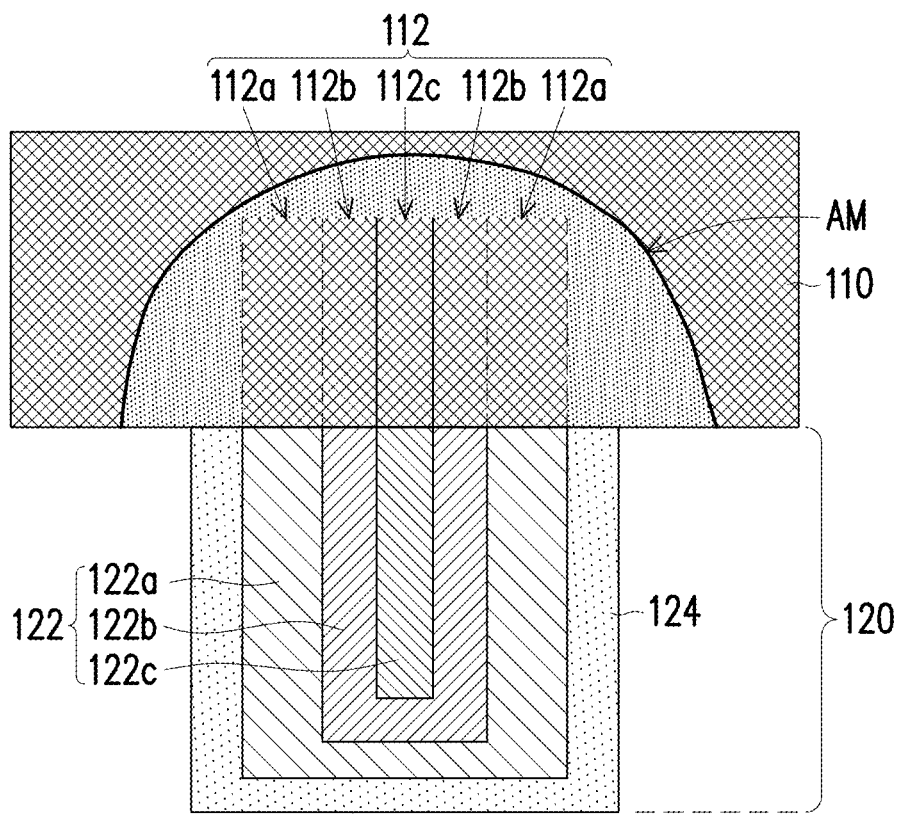

FIG. 6 is a diagram of a resistance variation of the phase change layer 110 with respect to a variation of amplitude of the current input to the heater 120 during a set programming operation according to alternative embodiments of the present disclosure. FIG. 7A through FIG. 7C are schematic diagrams illustrating the heater 120 and the phase change layer 110 of the memory device 100 at various stages during the set programming operation according to alternative embodiments of the present disclosure. The alternative embodiments to be described with reference to FIG. 6 and FIG. 7A through FIG. 7C are similar to the embodiments described with reference to FIG. 3A, FIG. 3B, FIG. 4A through FIG. 4D and FIG. 5, only the differences therebetween will be discussed, the same or the like parts will not be repeated again.

Referring to FIG. 1A and FIG. 6, in alternative embodiments, a resistance of the phase change layer 110 gradually decreases as an amplitude of the current input to the heater 120 increases during a multi-level set programming operation. In these alternative embodiments, the resistance of the phase change layer 110 is sequentially changed from the resistance state 00 to the resistance states 01, 10, 11. As similar to the embodiments described with reference to FIG. 5, each of the resistance states 01, 10, 11 shown in FIG. 6 is defined at a step of the resistance variation of the phase change layer 110 during the multi-level set programming operation.

Referring to FIG. 6 and FIG. 7A, during the transition from the resistance state 00 to the resistance state 01, at least one of the active region(s) 112 is subjected to a phase transition from the amorphous state to the crystalline state. For instance, as shown in FIG. 7A, the active region 112c is crystallized during the transition from the resistance state 00 to the resistance state 01, while the active regions 112a, 112b may remain amorphous. In some embodiments, an amplitude of a current pulse provided to the heater 120 for initiating the transition from the resistance state 00 to the resistance state 01 is high enough that the joule heat provided to the active region 112c by the heat conducting material 122c is able to crystallize the active region 112c. In addition, the amplitude of this current pulse should not be too high, so as to prevent phase transitions of the active regions 112a, 112b and melting of the active region 112c. In some embodiments, a duration time of this current pulse is longer than the duration time of the current pulse $P_{00}$ as described with reference to FIG. 3B. In addition, in some embodiment, this current pulse has a stair-down falling edge and a sharp/abrupt rising edge, as similar to the current pulses $P_{11}$, $P_{01}$, $P_{10}$ described with reference to FIG. 3B.

Referring to FIG. 6 and FIG. 7B, during the transition from the resistance state 01 to the resistance state 10, one or more of the active regions 112 is/are further subjected to the phase transition from the amorphous state to the crystalline state. For instance, as shown in FIG. 7B, the active region 112b is further crystallized during the transition from the resistance state 01 to the resistance state 10, while the active region 112a may currently remain amorphous. In some embodiments, an amplitude of a current pulse provided to the heater 120 for initiating the transition from the resistance state 01 to the resistance state 10 is high enough that the joule heat provided to the active region 112b by the heat conducting material 122b is able to crystallize the active region 112b. In addition, the amplitude of this current pulse should not be too high, so as to prevent phase transitions of the active regions 112a and melting of the active region 112c. In some embodiments, a duration time of this current pulse is longer than the duration time of the current pulse $P_{00}$ as described with reference to FIG. 3B. In addition, in some embodiment, this current pulse has a stair-down falling edge and a sharp/abrupt rising edge, as similar to the current pulses $P_{11}$, $P_{01}$, $P_{10}$ described with reference to FIG. 3B.

Referring to FIG. 6 and FIG. 7C, during the transition from the resistance state 10 to the resistance state 11, the rest of the active regions 112 is/are subjected to the phase transition from the amorphous state to the crystalline state, such that all of the active regions 112 are currently in the crystalline state. For instance, as shown in FIG. 7C, the active region 112a is further crystallized during the transition from the resistance state 10 to the resistance state 11. In some embodiments, an amplitude of a current pulse provided to the heater 120 for initiating the transition from the resistance state 10 to the resistance state 11 is high enough that the joule heat provided to the active region 112a by the heat conducting material 122a is able to crystallize the active region 112a. In addition, the amplitude of this current pulse should not be too high, so as to prevent melting of the active region 112b, 112c. In some embodiments, a duration time of this current pulse is longer than the duration time of the current pulse $P_{00}$ as described with reference to FIG. 3B. In addition, in some embodiment, this current pulse has a stair-down falling edge and a sharp/abrupt rising edge, as similar to the current pulses $P_{11}$, $P_{01}$, $P_{10}$ described with reference to FIG. 3B.

Although the multi-level set programming process shown in FIG. 6 is described as following a specific sequence (i.e., from the resistance state 00, the resistance state 01, the resistance state 10 to the resistance state 11) shown in FIG. 7A through FIG. 7C, such multi-level set programming process may not follow a certain sequence according to other embodiments. In other words, the resistance of the phase change layer 110 may be directly changed from the resistance state 00 to the resistance states 11, 01, 10 during the multi-level set programming process by setting the input currents provided to the heater 120 respectively within a range corresponding to a step of the resistance variation of the phase change layer 110 as shown in FIG. 6.

Figure 8:
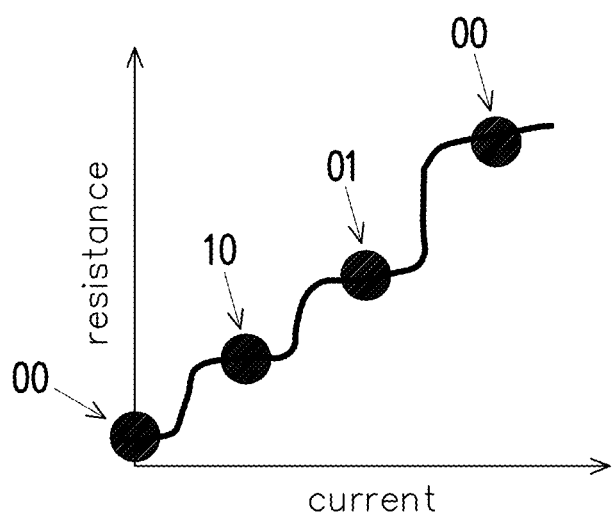
FIG. 8 is a diagram of a resistance variation of the phase change layer with respect to a variation of amplitude of the current input to the heater during a reset programming operation according to alternative embodiments of the present disclosure.

FIG. 8 is a diagram of a resistance variation of the phase change layer 110 with respect to a variation of amplitude of the current input to the heater 120 during a reset programming operation according to alternative embodiments of the present disclosure.

Referring to FIG. 1A and FIG. 8, during a reset programming operation, a resistance of the phase change layer 110 may be changed from the resistance state 11 to the resistance states 10, 01, 00. As similar to the set programming processes as described with reference to FIG. 5 and FIG. 6, the resistance states 01, 10, 11 are defined at steps of a resistance variation of the phase change layer 110 during the reset programming process (as shown in FIG. 8). As a possible mechanism, the higher the resistance state of the phase change layer 110 is programmed, the more of the active regions 112 are subjected to a phase transition from a crystalline state to an amorphous state, thus the input current with the higher amplitude is required to be provided to the heater 120 for producing joule heats to the active regions 112 of the phase change layer 110. In some embodiments, the currents input to the heater 120 during a reset programming process may be respectively provided as a current pulse similar to the current pulse $P_{00}$ as described with reference to FIG. 3B, and are different from one another in terms of amplitude. Furthermore, the reset programming process may follow the sequence from the resistance state 11, the resistance state 10, the resistance state 01 to the resistance state 00. Alternatively, the resistance of the phase change layer 110 may be directly changed from the resistance state 11 to the resistance states 10, 01, 00 during the reset programming process by setting the input currents provided to the heater 120 respectively within a range corresponding to a step of the resistance variation of the phase change layer 110 as shown in FIG. 8.

As above, the memory device according to embodiments of the present disclosure is a storage unit in a PCRAM. The memory device includes the bottom electrode, the heater standing on the bottom electrode, the phase change layer lying above the heater, and the top electrode disposed on the phase change layer. The heater comprises the heat conducting materials different from one another in terms of electrical resistivity. As having different electrical resistivities, the heat conducting materials can simultaneously produce different amounts of joule heat to the active regions in the phase change layer. In this way, the active regions can be selectively heated during a programming operation. By controlling an amplitude of the input current provided to the heater, some of the active regions can be subjected to a phase transition, while no phase transition or a reverse phase transition may be observed in other(s) of the active regions. Accordingly, multiple intermediate resistance states can exist between the most crystallized state (i.e., the lowest resistance state) and the most amorphous state (i.e., the highest resistance state) of the phase change layer, and a multi-level programming can be performed by using the memory device. Moreover, the phase change layer can be accurately programmed to a certain resistance state by controlling how many of the active regions is/are subjected to phase transition and what direction each phase transition goes. As a result, steps can be observed from the resistance variation of the phase change layer as the amplitude of the current input increases, and the resistance states are defined at these steps. In other words, the resistance of the phase change layer is substantially fixed within ranges of these steps. Therefore, the phase change layer can be accurately programmed to the resistance states by controlling the amplitude of the input current to be within certain ranges corresponding to these steps of the resistance variation. Accordingly, a verification step may be omitted from the multi-level programming of the memory device.

In an aspect of the present disclosure, a memory device is provided. The memory device comprises: a bottom electrode; a heater, disposed on the bottom electrode and comprising heat conducting materials, wherein electrical resistivities of the heat conducting materials are different from one another, a first one of the heat conducting materials has a periphery wall portion and a bottom plate portion connected to and surrounded by the periphery wall portion, a second one of the heat conducting materials is disposed on the bottom plate portion of the first one of the heat conducting materials, and laterally surrounded by the periphery wall portion of the first one of the heat conducting materials; a phase change layer, disposed on the heater and in contact with the heat conducting materials; and a top electrode, disposed on the phase change layer.

In another aspect of the present disclosure, a memory device is provided. The memory device comprises: a bottom electrode; a heater, disposed on the bottom electrode and having heat conducting regions configured to simultaneously produce different amounts of joule heat, wherein metallic element percentages of the heat conducting regions are different from one another; a phase change layer, disposed on the heater and in contact with top ends of the heat conducting regions; and a top electrode, disposed on the phase change layer.

In yet another aspect of the present disclosure, a programming method of a memory device is provided. The memory device comprises a bottom electrode, a heater disposed on the bottom electrode and having heat conducting materials different from one another in terms of electrical resistivity, and a phase change layer disposed on the heater and having active regions respectively in contact with one of the heat conducting materials of the heater. The programming method comprises: providing a first current pulse to the heater, so as to subject all of the active regions for phase transition; and providing a second current pulse to the heater, so as to select a portion of the active regions for phase transition.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a phase change layer, configured to store multilevel data; and
   a heater, comprising heat conducting materials having different resistivities and respectively in contact with the phase change layer, wherein a first heat conducting material of the heat conducting materials is formed in a recess shape, a second heat conducting material of the heat conducting materials is filled in a recess defined by the first heat conducting material, the heat conducting materials are formed of a metal nitride, a metal content in the first heat conducting material is greater than a metal content in the second heat conducting material, and a nitrogen content in the first heat conducting material is less than a nitrogen content in the second heat conducting material.

2. The memory device according to claim 1, wherein the heat conducting materials are respectively in direct contact with the phase change layer.

3. The memory device according to claim 1, wherein top surfaces of the heat conducting materials are substantially coplanar with one another.

4. The memory device according to claim 1, wherein bottom surfaces of the heat conducting materials lie at different height levels.

5. The memory device according to claim 1, wherein a third heat conducting material of the heat conducting materials is filled in a recess defined by the second heat conducting material, and is formed in a pillar shape.

6. The memory device according to claim 5, wherein a metal content in the third heat conducting material is less than the metal content in the second heat conducting material, and a nitrogen content in the third heat conducting material is greater than the nitrogen content in the second heat conducting material.

7. The memory device according to claim 1, wherein the heater further comprises a heat isolation layer covering a sidewall and a bottom surface of the first heat conducting material.

8. The memory device according to claim 7, wherein the heat isolation layer is electrically conductive, and a thermal conductivity of the heat isolation layer is lower than a thermal conductivity of any of the heat conducting materials.

9. The memory device according to claim 7, wherein a top surface of the heat isolation layer is in direct contact with the phase change layer, and substantially coplanar with top surfaces of the heat conducting materials.

10. The memory device according to claim 7, wherein the heat conducting materials are in contact with a bottom electrode through the heat isolation layer.

11. A memory device, comprising:
a phase change layer, configured to be switched among at least three resistance levels; and
a heater, in contact with the phase change layer and comprising metal nitride, wherein a metal content of the heater gradually decreases along a lateral direction pointing toward a central axis of the heater from a sidewall of the heater, and a nitrogen content of the heater gradually increases along the lateral direction.

12. The memory device according to claim 11, wherein a resistivity of the heater gradually increases along the lateral direction.

13. The memory device according to claim 11, wherein the heater is configured that a central region of the heater generates more thermal energy than a peripheral region of the heater does when the heater is provided with a voltage pulse.

14. A method for forming a memory device, comprising:
forming a heater in an opening of a dielectric layer, wherein the heater comprises heat conducting materials having different resistivities, a first heat conducting material of the heat conducting materials conformally extends along sidewalls and a bottom end of the opening, a second heat conducting material of the heat conducting materials is filled in a recess defined by the first heat conducting material, the heat conducting materials are formed of a metal nitride, a metal content in the first heat conducting material is greater than a metal content in the second heat conducting material, and a nitrogen content in the first heat conducting material is less than a nitrogen content in the second heat conducting material; and
forming a phase change layer on the dielectric layer and the heater.

15. The method according to claim 14, wherein a deposition process is involved in formation of the heat conducting materials, and deposition recipes for forming the first and second heat conducting materials are identical with each other in a flow rate ratio of a metal-containing precursor to a nitrogen-containing precursor.

16. The method according to claim 14, wherein a deposition process is involved in formation of the heat conducting materials, and deposition recipes for forming the first and second heat conducting materials are different from each other in a flow rate ratio of a metal-containing precursor to a nitrogen-containing precursor.

17. The method according to claim 14, wherein top surfaces of the heat conducting materials are substantially coplanar with a top surface of the dielectric layer.

18. The method according to claim 14, wherein top views of the heat conducting materials are circular and concentric, and a diameter of the first heat conducting material ranges from 10 nm to 40 nm.

19. The method according to claim 18, wherein a third heat conducting material is filled in a recess defined by the second heat conducting material and formed with a circular top-view shape, a diameter of the second heat conducting material ranges from 5 nm to 10 nm, and a diameter of the third heat conducting material ranges from 1 nm to 5 nm.

20. The method according to claim 14, wherein the heater further comprises a heat isolation layer underlining and laterally enclosing the heat conducting materials.

* * * * *